United States Patent [19]

Wohlmut

[11] 4,193,819
[45] Mar. 18, 1980

[54] LUMINESCENT PHOTOVOLTAIC SOLAR COLLECTOR

[75] Inventor: Peter G. Wohlmut, Palo Alto, Calif.

[73] Assignee: Atlantic Richfield Company, Los Angeles, Calif.

[21] Appl. No.: 918,220

[22] Filed: Jun. 23, 1978

[51] Int. Cl.² ............................................. H01L 31/04
[52] U.S. Cl. ................................ 136/89 PC; 250/227; 136/89 HY
[58] Field of Search ....................... 136/89 PC, 89 HY; 250/227

[56] References Cited

FOREIGN PATENT DOCUMENTS 2501907 7/1976 Fed. Rep. of Germany ............ 136/89
2620115 11/1977 Fed. Rep. of Germany ............ 136/89

OTHER PUBLICATIONS

A. Goetzberger et al., "Solar Energy Conversion with Fluorescent Collectors," *Appl. Phys.* vol. 14, pp. 123-139 (1977).

*Primary Examiner*—Aaron Weisstuch
*Attorney, Agent, or Firm*—Ronnie D. Wilson

[57] ABSTRACT

A photovoltaic device composed of a luminescent sheet having a pair of flat, opposed semicircularly shaped sides connected by a thin edge face having a curved, semicylindrically shaped section and a straight section and at least one photovoltaic cell carried on the straight section of said thin edge face.

8 Claims, 3 Drawing Figures

LUMINESCENT PHOTOVOLTAIC SOLAR COLLECTOR

This invention relates generally to apparatus for converting solar energy to electricity by means of solar cells and more particularly to apparatus of this type which more efficiently collects and concentrates available sunlight for utilization by such cells.

It is well known that a photovoltaic semiconductor p-n junction can convert to electricity only that portion of the incident photon energy spectrum, typically solar radiation, which creates hole-electron pairs within a given semiconductor material. Thus, for example, in a silicon photocell only that portion of the solar spectrum with energy in the vicinity of 1.1 electron volts per photon is converted into electricity. Photons of lesser energy are not absorbed at all. More energetic photons are strongly absorbed and are wasted in heating the cell, which further degrades its energy conversion efficiency. Clearly, therefore, to maximize the efficiency of a given photovoltaic cell, it is advantageous to convert as much of the available light as possible into an energy range to which such cell can usefully respond before the light strikes the cell's surface.

An existing technique for achieving such conversion takes advantage of the fact that light falling upon a luminescent material or agent is characteristically re-radiated or emitted in a narrow band of wavelengths of known energy content. Also, light absorbed by such a material in one direction is re-radiated in many directions. Such agents include, for example, organic dyes which are used in scintillation counters, lasers and the like. For the purposes of this application the term "luminescent agent" is understood to include materials exhibiting all species of luminescence, including but not limited to fluorescence and phosphorescence.

It has been shown that a dispersal of such luminescent materials within an internally reflective sheet of transparent glass or plastic, one of whose major surfaces is exposed to the sun, concentrates and focuses a flux of light of known energy level toward one or more of the edge faces of such sheet. If a photovoltaic cell responsive only to light at that energy level is placed against or optically coupled to such edge face, the energy conversion efficiency of the cell increases several times. In this application a light-transmissive sheet of such construction and properties is termed a "luminescent sheet" and a photovoltaic solar collector employing such a sheet is termed a "luminescent solar collector". A luminescent solar collector of this type is fully and completely disclosed and applied in *Optics*, Vol. 15, No. 10, pp. 2299-2300, dated October 1976, the disclosure of which is incorporated herein by reference.

A thin, luminescent sheet of the type described produces a high multiplication of incident light intensity on an edge-mounted solar cell because of the relatively small area of an edge face in relation to the larger area exposed to the sun. For example, for a luminescent sheet 2 feet square and ⅛ inch thick, this multiplication factor is approximately 200 to 1. This light intensification theoretically enables one to increase solar cell power output per unit surface area by the same factor.

This greater light intensity may, however, result in correspondingly increased cell temperature either because of the relatively greater heating effect of high energy photons or as a result of IR heating under load conditions. If this temperature rises significantly, external cooling means may become necessary to avoid serious degradation of cell efficiency.

In addition, a certain amount of the available surface area of the cell facing the edge face of a luminescent sheet must be occupied by conductive elements for making connections between the cell and an external load circuit. Such conductors block the passage of useful radiation into the cell. The smaller the total cell surface area, the greater is the proportionate loss of total received light energy for conductors of a given size and current carrying capability.

Finally, as the edge face surface area becomes sufficiently small, it is no longer feasible to employ edge-mounted solar cells of conventional design and size.

One solution to the potential problems outlined above might be simply to increase the entire thickness of the luminescent sheet. This has the drawback, however, of increasing the weight and cost per unit area of the sheet to a point which may become uneconomical.

Some previous studies have concentrated on rectangular and triangular configurations to achieve a suitable solar collector, a suitable collector being one wherein (1) the total light path in the collector is minimized to reduce absorption losses which produce exponentially decreasing light intensities:

$$I = I_0 e^{-aL}$$

where I is the intensity, a is the dye and solvent absorption is constant at particular wavelengths, and L is the light path length and (2) the total number of internal reflections and losses through the faces of the collector are minimized.

It has been found that the hemispherical configuration is the superior configuration to the triangle or rectangle.

It is therefore a general object of this invention to provide a new and improved photovoltaic solar collector employing a luminescent sheet.

It is a more specific object of this invention to provide a luminescent solar collector of greater versatility under a variety of operating conditions.

It is a still more specific object of this invention to provide a luminescent solar collector employing a thin, luminescent sheet of substantially constant thickness which may be optically coupled to edge-mounted solar cells of varying size.

According to this invention, there is provided a luminescent photovoltaic device comprising a light transmitting luminescent sheet which has at least one pair of flat, opposed essentially parallel semicircularly shaped sides connected by a thin edge face having a curved, semicylindrically shaped section and a straight section and at least one photovoltaic cell carried on the straight section of said thin edge face for receiving the light flux concentrated thereon.

Other objects and advantages of this invention will become apparent from a consideration of the detailed description to follow taken in conjunction with the figures and the appended claims.

Figure 1:
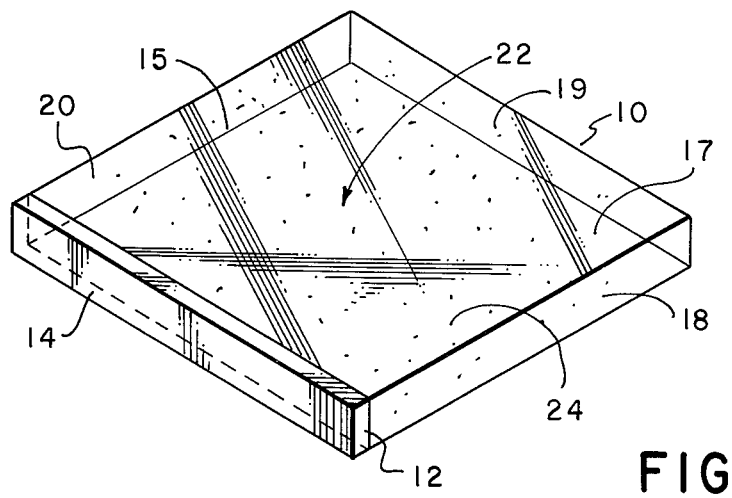
FIG. 1 shows a prior art luminescent solar collector.
Figure 2:
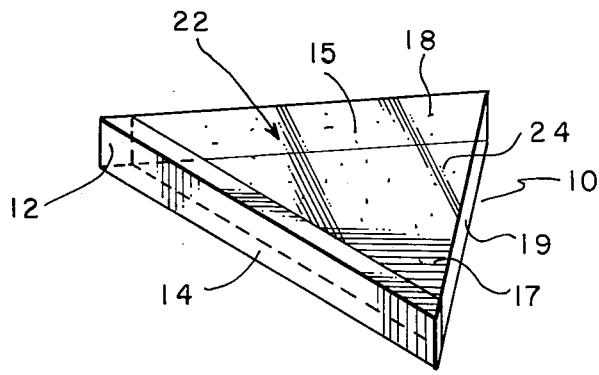
FIG. 2 shows an additional prior art luminescent solar collector.

FIGS. 1 and 2 show prior art luminescent solar collectors of different geometry. The collector of FIG. 1 consists of a rectangular planar luminescent sheet 10, one edge face 12 of which is substantially covered by a solar cell 14. Sheet 10 is composed of a matrix material impregnated with one or more luminescent agents represented diagrammatically by dots 15. The bottom surface 17 and the remaining three edge faces 18, 19 and 20 may be mirrored for high reflectance.

FIG. 2 consists of a triangular planar luminescent sheet 10, one edge face 12 of which is substantially covered by a solar cell 14. Sheet 10 is composed of a matrix material impregnated with one or more luminescent agents represented diagrammatically by dots 15. The bottom surface 17 and the remaining two edge faces 18 and 19 may be mirrored for high reflectance.

In accordance with the prior art teachings, a ray of sunlight represented by arrow 22 impinges on the transparent, polished upper surface 24 and passes into the interior of the luminescent sheet 10. When the ray 22 impacts a luminescent agent 15, it is partially absorbed and re-emitted in a narrow wavelength band efficiently usable by the photovoltaic cell 14. This re-emitted light is re-radiated in many directions, which increases the probability of internal reflections. With successive reflections of these re-emitted rays, it has been established that an intense flux of light at the desired wavelength is funneled to the edge 12 where it impinges on the photocell 14 and stimulates the desired energy conversion.

According to the teachings of this invention, means are devised for providing a solar collector having the shortest path length and the smallest collector edge for a given area, while producing a more efficient conversion of sunlight to energy than prior art configurations.

Figure 3:
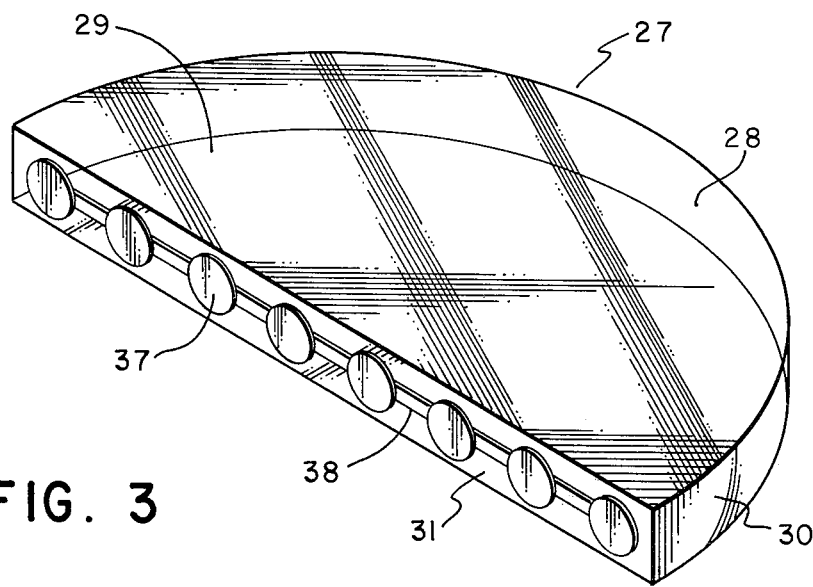
FIG. 3 is a device in accordance with a preferred embodiment of this invention.

FIG. 3 shows a solar collector in accordance with a preferred embodiment of the invention, employing a luminescent sheet 27. Upper and lower surfaces 28 and 29 are connected by an edge face having curved, semicylindrically shaped section 30 and straight section 31. Edge face 30 and lower surface 29 are made suitably reflectant so that all the light incident on upper surface 28 is concentrated and focused in the direction of the face 31. Edge face 30 can be covered with a mirror or other reflecting medium or with a diffusive medium to break up the incident light in order to maximize internal reflection. Positioned in adherent, contiguous contact with edge face 31 are one or more photocells 37, which for purposes of illustration are shown to be of circular configuration. It will be understood however that within the scope of this invention the cells 37 may be shaped by wellknown means to further enlarge the percentage of the available area of the edge face 31 covered thereby.

Light in a desired energy band generated by luminescent sheet 27 will now distribute itself over the surface area of the edge face 31 and the corresponding surface area of cells 37. Cells 37 are thereupon stimulated to provide an electrical output through conventional conductors 38 as shown. In this manner one may couple the edge-directed light energy of a thin, luminescent sheet into solar cells.

The size of sheet 27 and the thickness of edge faces 30 and 31 may be varied in accordance with factors such as cell characteristics, cell cost per unit area, expected average light intensity, external cell cooling means, power requirements, physical installation limitations, and the like. Those skilled in this art will have no difficulty in assigning appropriate weight to such factors in designing a luminescent solar collector in accordance with this invention.

In a further embodiment, a plurality of photovoltaic cells are employed with interstices between adjacent cells and a diffuser material covers at least a part of the interstices. The diffusive material may also cover one of the sides and the curved section of the thin edge face.

The luminescent sheets shown in FIG. 3 may be made of glass or polymeric material or other transparent material into which luminescent agents can be incorporated and dispersed by well-known means, so long as the matrix material can be cast, molded, or cut into the indicated geometric shape. The luminescent materials may include commercially available metals, oxides, or other metallic compounds whose characteristics are well known to the art. Such materials include, for example, neodymium oxide in a glass matrix or laser dyes from the coumarin or rhodamine families. Within the scope of this invention, the luminescent agents employed may either emit light directly or by way of cascading, which approaches the desired energy range for a specific type of photovoltaic cell.

Photovoltaic cells which may be used in the practice of this invention may include silicon, germanium, gallium arsenide and many other semiconductor materials well known to the art. As previously pointed out, the photovoltaic cells to be employed in this invention are not limited as to size or shape or configuration or precise placement upon the surface of the edge face toward which light flux is directed. Any suitably adherent means are acceptable for applying the cells to the edge face of the luminescent sheet.

Computer ray tracing runs for a variety of geometric configurations were made assuming an absorption coefficient A on the order of 0.001 cm and no losses through the primary surfaces. The table presented herewith shows that the semicircular configuration is more efficient than the triangular or rectangular configurations. The table summarizes the results under a four percent (4%) reflection loss condition. The semicircle produces the highest efficiency for a given area.

TABLE

| Area CM$^2$ | Input Energy | Efficiency of Various Collector Geometries ||||||||
| | | Semicircle ||| Triangle ||| Rectangle |||
| | | $E_T$ | M % | E/L | $E_T$ | M % | E/L | $E_T$ | M % | E/L |
|---|---|---|---|---|---|---|---|---|---|---|
| 100 | 1 | 0.954 | 95.4 | 0.060 | 0.933 | 93.3 | 0.047 | 0.828 | 82.8 | 0.083 |
| 1000 | 10 | 9.335 | 93.4 | 0.185 | 9.168 | 91.9 | 0.145 | 7.914 | 79.1 | 0.250 |

$E_T$ = Total Energy
M % = Efficiency %
E/L = Energy Per Unit Length
% Efficiency is ratio of total light collected on active edge to total light incident on collector.
Energy per unit length is average light intensity per unit length on active edge.
Absorption coefficient = 0.001
A 4% reflective loss is assumed for each edge internal reflection.

The embodiments of the invention in which an exclusive property or privilege is claimed are defined as follows:

1. A photovoltaic array comprising a luminescent member having a pair of flat, opposed essentially parallel semicircularly shaped sides, each of said sides being joined by a thin edge face having a curved, semicylindrical section and a straight section and at least one photovoltaic cell carried on the straight section of said thin edge face.

2. A device according to claim 1 wherein said luminescent member carries a reflective means on one of said flat sides and on the curved section of said edge face.

3. A device according to claim 2 wherein a plurality of photovoltaic cells are employed with interstices between adjacent cells and a diffuser material is employed in at least part of said interstices.

4. A device according to claim 1 wherein a plurality of photovoltaic cells are employed leaving interstices between adjacent cells.

5. A device according to claim 4 wherein a diffusive material covers said interstices.

6. A device according to claim 5 wherein said diffusive material also covers one of said sides and the curved section of said edge face.

7. A device according to claim 1 wherein said luminescent member carries a plurality of photovoltaic cells with interstices between adjacent cells and diffusive material covers at least part of said interstices.

8. A device according to claim 7 wherein said diffuser material also covers one of said sides and the curved section of said edge face.

* * * * *